United States Patent [19]
Reid

[11] Patent Number: 4,951,370
[45] Date of Patent: Aug. 28, 1990

[54] METHOD OF MAKING AN INTELLIGENT MULTIPROBE TIP

[75] Inventor: Lee R. Reid, Plano, Tex.

[73] Assignee: Texas Instruments Incorporated, Dallas, Tex.

[21] Appl. No.: 401,702

[22] Filed: Sep. 1, 1989

Related U.S. Application Data

[60] Division of Ser. No. 515,441, Jul. 19, 1983, Pat. No. 4,888,550, which is a continuation of Ser. No. 301,605, Sep. 4, 1981, abandoned, which is a continuation of Ser. No. 90,956, Nov. 5, 1979, abandoned.

[51] Int. Cl.$^5$ .............................................. H01L 41/22
[52] U.S. Cl. .................................. 29/25.35; 310/330; 324/158 P; 427/100
[58] Field of Search ........................ 29/25.35; 427/100; 324/158 P, 158 F, 72.5; 310/330; 369/137, 138

[56] References Cited

U.S. PATENT DOCUMENTS

| | | | |
|---|---|---|---|
| 2,499,196 | 2/1950 | Mencke | 369/173 |
| 2,596,494 | 5/1952 | Lynch | 310/330 |
| 2,624,853 | 1/1953 | Page | 310/330 |
| 2,944,117 | 7/1960 | Gray | 310/330 |
| 4,219,771 | 8/1980 | Reid et al. | 324/158 P |

Primary Examiner—Carl E. Hall
Attorney, Agent, or Firm—James T. Comfort; Melvin Sharp; Rene E. Grossman

[57] ABSTRACT

An intelligent multiprobe tip comprising a mounting member comprised essentially of piezoelectric material wherein, through appropriately locating metalized areas, the characteristics of the piezoelectric material are employed to insulate selected regions from each other while providing an appropriate force-induced output signal responsive to the contact of an attached tip with a movable work piece.

3 Claims, 1 Drawing Sheet

U.S. Patent    Aug. 28, 1990    4,951,370
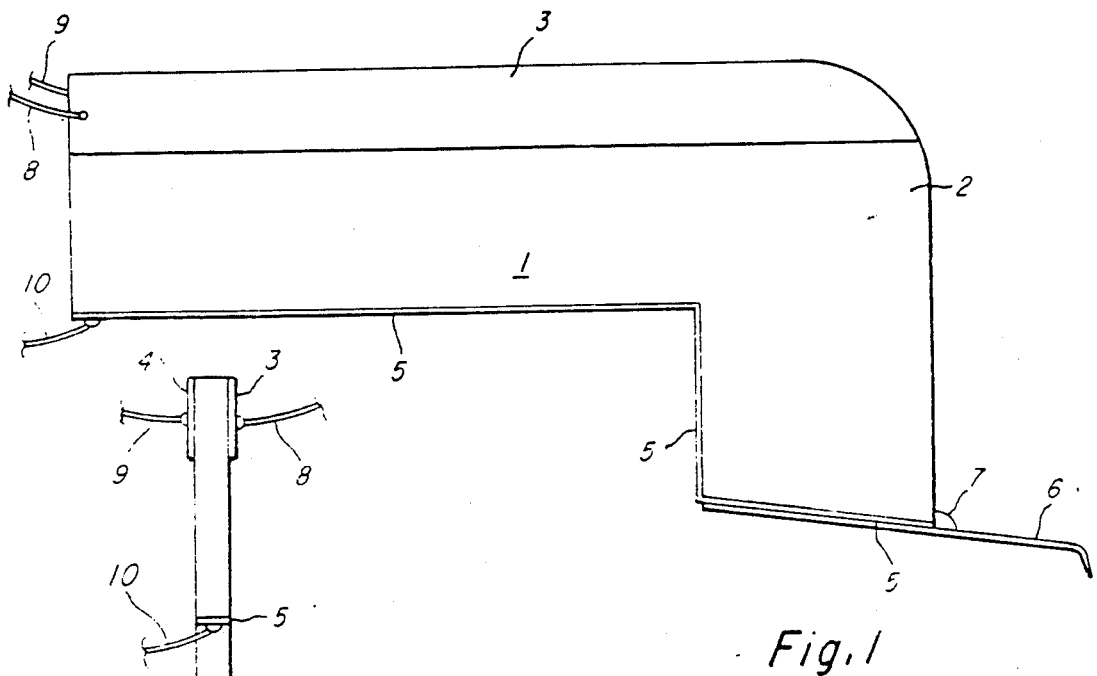
Fig. 1
Fig. 2
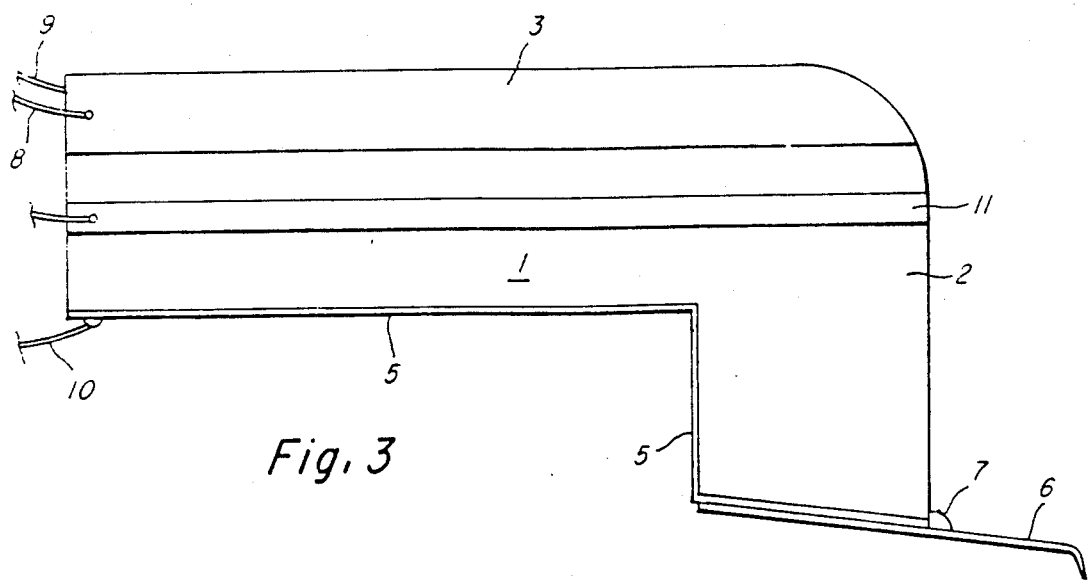
Fig. 3

METHOD OF MAKING AN INTELLIGENT MULTIPROBE TIP

This is a division of application Ser. No. 06/515,441, filed Jul. 19, 1983, now U.S. Pat. No. 4,888,550, which is a continuation of Ser. No. 06/301,605 filed Sep. 4, 1981, now abandoned, which is a continuation of Ser. No. 06/090,956 filed Nov. 5, 1979, now abandoned.

This invention relates to intelligent multiprobe tips and more particularly to such tips having improved contact sensing capabilities.

Intelligent multiprobe tips have heretofore been proposed, illustrative of which are those described in co-pending U.S. patent application Ser. No. 873,564 filed by Lee R. Reid on Jan. 30, 1978, Ser. No. 893,118 filed by Lee R. Reid and Charles R. Ratliff on Apr. 4, 1978 and Ser. No. 879,038 filed by Lee R. Reid and Charles Ratliff on Feb. 21, 1978.

According to these prior proposals, a small thin piezoelectric member was affixed to a larger mounting member to which also there was attached a probe tip. In operation, an electrical signal was produced by the piezoelectric member when sufficient force was imparted to the probe tip to cause flexing of the mounting member and corresponding flexing of the piezoelectric member.

While the foregoing proposal constituted substantial improvements in the prior art, greatly contributing to reliability and accuracy of testing and markedly reducing damage to the work pieces by the probes, there nevertheless continued to be sought a simplified construction which would offer manufacturing economies and improved reliability including reduction in maintenance.

Accordingly, it is one general object of this invention to improve multiprobe tips. It is another object of this invention to simplify construction of such tips.

It is another object of this invention to decrease maintenance and increase reliability of such tips.

Accordingly, in accordance with one feature of the invention, an L-shaped member is basically comprised of piezoelectric material, thereby eliminating the necessity for a composite structure.

In accordance with another feature of the invention, relatively simple metalizations are employed to provide electrical conductors along said L-shaped member, thereby simplifying manufacture.

In accordance with another feature of the invention, the multiprobe tip is attached by conventional means to one of the metalized surfaces on the L-shaped member as, for example, by soldering, thereby further contributing to simplification of manufacture.

In accordance with one alternative feature of the invention, in applications contemplating heavy duty service, epoxy material is optionally applied either to a small surface of the piezoelectric member in the region immediately surrounding the point at which the needle extends therefrom, thereby adding significant strength and reducing vulnerability to breakage, or to the entire assembly except for the tip.

In accordance with an optional feature, in small geometry embodiments where spacing is such that unwanted internal electrical coupling may occur, an additional metallization may be laid down upon appropriate surfaces of the piezoelectric member, and such additional metallization may be grounded, thereby effectively electrically isolating appropriate portions of the member.

These and other objects and features of the invention will be apparent from the following detailed description, by way of example, with reference to the drawing in which:

FIG. 1 is a side view of a preferred embodiment of the invention;

FIG. 2 is an end view of the embodiment of FIG. 1; and

FIG. 3 is a side view similar to that of FIG. 1 except for an additional optional metallization which may be employed to enhance electrical isolation.

BACKGROUND OF THE INVENTION

To more fully appreciate the invention, it may be helpful to review the background thereof.

In the formation of electronic circuits, integrated circuits may be fabricated from thin semiconductor slices having a plurality of matrices or micro circuits thereon. Customarily, each slice contains a multiple of identical repeating matrices of the same type of micro circuits. The individual unit or circuit is sometimes referred to as an integrated circuit chip or an individual bar.

Before final processing and encapsulation, it is customary to test each of the circuits on an overall integrated circuit chip on a slice or a wafer prior to separating the slice into the desired components or combinations thereof.

Since each micro circuit or integrated circuit of each wafer is normally positioned in a predetermined precise relation with respect to adjacent circuit units, it is possible to test the circuitry if a probe can be accurately located on each preselected point that corresponds to the circuit to be tested. It is thus possible, for example, to test several different circuits at the same time on any one integrated circuit portion.

In the test procedure, there are several obstacles to overcome in order to have reliable testing without damaging the slice. One of the difficulties experienced in the use of testing probes which include a supporting body having a needle connected thereto, is that the point of the probe tip may form a scratch on the surface of the semiconductor wafer as it is contacted by the point. This is caused by the lack of an effective z-axis control. As will be evident to those skilled in the art, the z-axis is the direction established by the vertical movement of the chuck with respect to the probe tips. Among other things, the z-axis control is needed to compensate for the surface warpage of slices which may be as much as 5 mils across the entire surface of a large slice, determining the point of contact with the wafer and determining when the probe tips are off the slice, i.e., edge detection.

Semiconductor slice testing is performed on a multiprobe machine such as that manufactured by Electroglass Corporation of Menlo Park, Calif., e.g., Model 1034X. The multiprobe machine contains a probe card which is a printed circuit board having attached thereto a series of data probes for injecting signals and collecting test data from the semiconductor slice. The practice according to the prior art includes an edge sensor on the probe card which is in the form of a data probe having an electrical switch mechanism. Operationally, the conventional edge sensor functions such that when the probe tip makes contact with the silicon slice, an electrical open is caused. This open is detected by the multiprobe system and allows for a continuance of the testing procedures. When the chuck or support block for the semiconductor slice is vertically moved to make contact with the probe tips and no contact is detected by the edge sensor, the open condition will not occur and the multiprobe system will perform an indexing procedure and move the slice such that the data probes are over the next row of integrated circuit chips. This conventional edge sensor has been found to be unreliable in the art and the cause of significant amount of downtime of the multiprobe system and damage to chips which results when the chuck is continuously moved upward and probe tip contact is not identified. After the probe tips make contact with the slice, it is necessary for the chuck to yet move an additional two to five mils of over travel in order to break through the oxide layer and make good electrical contact with the active circuit elements, a technique called scrub-in. If the probe contact with the slice is not identified, the over travel cannot be controlled and the result is probe tip breakage, excessive over travel, which damages chips and in addition, machine downtime.

To overcome the foregoing deficiencies, the proposals made in the aforementioned copending applications were made. In accordance therewith, adjustable mounting members were included. On the mounting members were disposed the contact-making tips and in addition a separate small region of piezoelectric material. In operation, when the probe tips made contact with the workpiece, a small yet effective force was imparted thereto and this was in turn imparted to the mounting member. A minute deflection of the mounting member resulted in the corresponding deflection of the piezoelectric material attached thereto, whereupon a very small yet detectable voltage was developed by the piezoelectric material, and this voltage was conducted to detecting circuits which sensed the existence of such voltage and were used to position the chuck accordingly. While these proposals were effective and constituted a marked advancement in the probe testing equipment of the prior art, there nevertheless continued to be a need for increased simplification, reduced cost of manufacture, enhanced reliability and low maintenance.

DETAILED DESCRIPTION OF THE INVENTION

Reference to FIG. 1 reveals a probe assembly 1 comprising a generally L-shaped member 2 comprised of piezoelectric material such as zirconate-lead titanate (PZT). In accordance with a preferred embodiment, the L-shaped member was made with a thickness of approximately 20 mils, an overall height of approximately 275 mils and an overall width of approximately 550 mils. The vertical dimension of the tail of the L was approximately 150 mils, the width of the downwardly extending portion was approximately 150 mils, and the lower surface of the downwardly extending portion was inclined at an angle of about 7° from the horizontal. However, it should be evident to those skilled in the art, that such dimensions will vary markedly, depending upon the particular equipment with which the tip probe is used, and that other dimensions may be more optimally related to such other equipment.

The probe itself is further connected to a probe card or printed circuit board along with a plurality of similar probes for testing the semiconductor slices. A z-axis signal generated by the piezoelectric material is recognized by the sensing circuits of the multiprobe system to indicate that the detector has made contact with the surface of the semiconductor slice allows the multiprobe system to move a chuck support a fixed additional distance in the z-axis direction to insure total data probe contact and proper scrub-in.

In accordance with the preferred embodiment of the present invention, the entire L-shaped member is made of piezoelectric material, and advantage is taken of the fact that when the material is normally in a quiescent state it exhibits very high electrical resistance and consequently acts as an excellent insulating mounting member itself on which other coacting portions may be affixed.

On L-shaped member 2, there are disposed three electrical conductors 3, 4 and 5. These are preferably deposited layers of suitable materials such as silver or electroless nickel. Because of the high resistance qualities of the piezoelectric material, these metalized areas are effectively insulated from each other through the main member 2.

The probe tip 6 is conductively attached to the thin metalized region 5 which lies along the bottom surface of the downward extending portion of member 2 by any suitable means such as soldering. The needle itself is made of any suitable resilient conductive material and is conventional to those skilled in the art.

Also shown in FIG. 1 is an optional reinforcing region 7 which provides additional support and connective strength between the needle 6 and the main member 2. This additional connective material may be any suitable substance such as epoxy.

As mentioned above, the entire assembly may be coated with a suitable protective coating such as epoxy.

Further reference to the FIGURES reveals electrical connections 8, 9 and 10 individually made to the metalized regions 3, 4 and 5. Connection 10 is made to the conventional circuits of the aforementioned tester which supplies and obtains from the chip electrical quantities that are analyzed by the testing equipment to determine the operability of the integrated circuit.

Connections 8 and 9 are those which convey the electrical signal developed by the piezoelectric material itself to utilization circuits (not shown) which sense the presence of the signal and control travel of the z-axis chuck.

Further, the probe assembly 1 is connected to the probe card or printed circuit board of the aforementioned test equipment, along with a plurality of similar probes which are used for testing the semiconductor slice and the z-axis signal received by the utilization circuits indicating that the detector probe has made contact with the surface of the semiconductor slice conditions the multiprobe system to move the chuck support a fixed distance in the z-axis thereafter to insure total data probe contact and proper scrub-in.

The test needle 6 which contacts the semiconductor slice therefore performs two functions. First of all, through the force that it imparts to the piezoelectric material directly, it results in the development of the aforementioned piezoelectric voltage which is conducted via leads 8 and 9 to the utilization circuits. Thereafter, when the chuck has traveled the additional 2 to 5 mils, electrical contact is made by the tip of the needle with an appropriate location on an underlying integrated circuit and electrical quantities are conducted thereto and therefrom via the needle itself, metalization 5 and electrical conductor 10.

In accordance with the invention herein, voltages in the range of approximately 350 milivolts have been produced at output terminals 8 and 9 in response to contact of the probe tip with a semiconductor wafer. As will be recognized by those skilled in the art, such voltage is amply sufficient to permit detection thereof and utilization in conventional circuits.

An alternative structure is depicted in FIG. 3. There it will be observed that there is included an additional metalization 11 which occurs on both sides of the member 2 in corresponding locations. In embodiments where vertical geometries are exceedingly small and where, accordingly, there might be come capacitive or other coupling between the voltages existing or imparted to metalization 5 and those developed in the principal piezoelectric detecting metallizations 3 and 4, the guard layers 11 may be advantageously employed. When grounded, guard layers 11 tend to reduce or eliminate any coupling of electrical potentials between the aforementioned portions.

It will now be evident to those skilled in the art, that although the description hereof illustrates the invention in specific embodiments, other materials and dimensions could readily be employed without departing from the scope and spirit thereof. For example, layers 3 and 4 might be both positioned on the same, rather than opposite, sides of the main member 2.

The words and expressions employed are intended as words of description and not of limitation, and there is no intention in the use thereof of excluding any equivalents, but on the contrary, it is intended to include any and all equivalents, adaptations and modifications that may be employed without departing from the spirit and scope of the invention.

What is claimed is:

1. A method of making a probe assembly comprising the steps of:
   (a) forming a generally L-shaped mounting support member comprised substantially and integrally of piezoelectric material;
   (b) depositing on the bottom surface of the downwardly extending portion of said mounting support member a thin layer of first metallization;
   (c) depositing on the bottom surface of the longitudinal portion of said mounting support member a thin layer of second metallization;
   (d) electrically coupling said first and second metallizations by depositing a thin layer of third metallization on an adjacent vertical surface of the downwardly extending portion of said mounting support member;
   (e) conductively mounting and affixing to said first metallization, on the lower surface of the downwardly extending portion of said mounting support member, a needle-shaped probe tip comprised substantially of resilient conductive material;
   (f) depositing generally along an upper quarter of one vertical surface of the longitudinal portion of said mounting support member a thin layer of fourth metallization, said fourth metallization formed so as to be electrically insulated from all other metallizations by said piezoelectric mounting support member material;
   (g) depositing generally along an upper quarter of the opposite vertical surface of the longitudinal portion of said mounting support member a thin layer of fifth metallization, said fifth metallization formed so as to also be electrically insulated from all other metallizations by said piezoelectric mounting support member material.

2. A method as set forth in claim 1 further comprising the step of depositing generally along a second quarter of one vertical surface of the longitudinal portion of said mounting support member a thin layer of sixth metallization, said sixth metallization formed so as to be electrically insulated from all theretofore metallizations by said piezoelectric mounting support member material.

3. A method as set forth in claim 2 further comprising the step of depositing generally along a second quarter of the opposite vertical surface of the longitudinal portion of said mounting support member a thin layer of seventh metallization, said seventh metallization formed so as to be electrically coupled to said sixth metallization and electrically insulated from all other heretofore metallizations by said piezoelectric mounting support member material.

* * * * *